United States Patent
Iacopi et al.

(10) Patent No.: US 9,771,665 B2
(45) Date of Patent: Sep. 26, 2017

(54) PROCESS FOR FORMING GRAPHENE LAYERS ON SILICON CARBIDE

(71) Applicant: Griffith University, Nathan (AU)

(72) Inventors: Francesca Iacopi, West End (AU); Mohsin Ahmed, Nathan (AU); Benjamin Vaughan Cunning, Macgregor (AU)

(73) Assignee: GRIFFITH UNIVERSITY, Nathan, Queensland (AU)

( * ) Notice: Subject to any disclaimer, the term of this patent is extended or adjusted under 35 U.S.C. 154(b) by 0 days.

(21) Appl. No.: 15/022,532

(22) PCT Filed: Sep. 8, 2014

(86) PCT No.: PCT/AU2014/050218
§ 371 (c)(1),
(2) Date: Mar. 16, 2016

(87) PCT Pub. No.: WO2015/035465
PCT Pub. Date: Mar. 19, 2015

(65) Prior Publication Data
US 2016/0230304 A1    Aug. 11, 2016

(30) Foreign Application Priority Data

Sep. 16, 2013 (AU) .................... 2013903547
Jul. 18, 2014 (AU) .................... 2014902792

(51) Int. Cl.
*H01L 21/00* (2006.01)
*C30B 1/02* (2006.01)
(Continued)

(52) U.S. Cl.
CPC ............ *C30B 1/026* (2013.01); *B81C 1/0038* (2013.01); *C01B 31/0446* (2013.01);
(Continued)

(58) Field of Classification Search
None
See application file for complete search history.

(56) References Cited

U.S. PATENT DOCUMENTS 9,053,932 B2 * 6/2015 Lee ................. H01L 21/0242
2009/0155561 A1 * 6/2009 Choi ................. B82Y 30/00
428/220

(Continued)

FOREIGN PATENT DOCUMENTS

| CN | 101834206 | 9/2010 |
| JP | 2012-025004 | 2/2012 |
| KR | 20110064162 | 6/2011 |

OTHER PUBLICATIONS

"Segregation Growth of Graphene on CuNi Alloy for Precise Layer Control" by Liu et. al., 2011.*

(Continued)

*Primary Examiner* — Evren Seven
(74) *Attorney, Agent, or Firm* — Knobbe, Martens, Olson & Bear, LLP

(57) ABSTRACT

A process for forming graphene, includes: depositing at least a first and a second metal onto a surface of silicon carbide (SiC), and heating the SiC and the first and second metals under conditions that cause the first metal to react with silicon of the silicon carbide to form carbon and at least one stable silicide. The corresponding solubilities of the carbon in the stable silicide and in the second metal are sufficiently low that the carbon produced by the silicide reaction forms a graphene layer on the SiC.

18 Claims, 8 Drawing Sheets

(51) Int. Cl.
*C30B 1/10* (2006.01)
*C30B 29/02* (2006.01)
*C01B 31/04* (2006.01)
*B81C 1/00* (2006.01)
*H01L 21/02* (2006.01)

(52) U.S. Cl.
CPC ............ *C01B 31/0461* (2013.01); *C30B 1/10* (2013.01); *C30B 29/02* (2013.01); *H01L 21/00* (2013.01); *H01L 21/02381* (2013.01); *H01L 21/02447* (2013.01); *H01L 21/02491* (2013.01); *H01L 21/02527* (2013.01); *H01L 21/02614* (2013.01); *B81C 2201/0197* (2013.01)

(56) References Cited

U.S. PATENT DOCUMENTS

| | | | | |
|---|---|---|---|---|
| 2011/0104442 | A1* | 5/2011 | Yoon | B82Y 30/00 428/152 |
| 2011/0189406 | A1* | 8/2011 | Cho | C23C 14/48 427/523 |
| 2012/0161098 | A1* | 6/2012 | Hiura | C23C 16/0218 257/9 |
| 2013/0127023 | A1* | 5/2013 | Zenasni | C23C 16/56 257/635 |
| 2013/0202813 | A1* | 8/2013 | Chueh | C01B 31/0446 427/557 |
| 2014/0017883 | A1* | 1/2014 | Dal | H01L 21/02378 438/478 |
| 2014/0227162 | A1* | 8/2014 | Joh | C01B 31/0446 423/448 |
| 2015/0129544 | A1* | 5/2015 | Davis | B82B 1/005 216/39 |

OTHER PUBLICATIONS

"Graphene Epitaxy by Chemical Vapor Deposition on SiC" by Strupinsky et al., 2011.*

"Synthesis of graphene on silicon carbide substrates at low temperature" by Juang et al., 2009.*

Li, et al. 2009 "Evolution of graphene growth on Cu and Ni studied by carbon isotope labeling" *Nano Letters* 9(12): 4268-4272.

Cunning, B.V. et al. 2014 "Graphitized silicon carbide microbeams: wafer-level, self-aligned graphene on silicon wafers" Nanotechnology 25: 325301 (in 7 pages).

Supplemental Partial European Search Report in corresponding European Application No. 14 84 3830, dated Mar. 6, 2017.

Zenasni, A. et al. 2012 "Free-suspended graphene synthesis via carbon diffusion through platinum-based metal" Applied Physics Letters 100: 151907 (in 3 pages).

* cited by examiner

PROCESS FOR FORMING GRAPHENE LAYERS ON SILICON CARBIDE

TECHNICAL FIELD

The present invention relates to a process for forming graphene layers on silicon carbide.

BACKGROUND

Both Silicon Carbide (SiC) and Silicon (Si) are semiconducting materials that are used to create products such as memory, light emitting diodes (LEDs), micro-electro-mechanical systems (MEMS) and other types of devices. Crystalline SiC is the material of choice for MEMS transducers when device reliability in extreme environments is a primary concern. However, due to both the high cost of bulk SiC wafers, and their expensive bulk micromachining processes, the use of SiC has been limited to only a few applications, typically those found in the aerospace industry.

However, as described in International Patent Application No. PCT/AU2010/000153 (published as WO2010/091473), entitled "A chemical vapour deposition system and process", a new type of SiC growth reactor was recently developed, allowing the deposition of thin, high quality epitaxial layers of SiC onto Si wafers up to 300 mm in diameter. This breakthrough has opened up the opportunity for Sic-based devices to be produced with superior performance at a reasonable cost.

Thin film epitaxial SiC on Si has a vast potential for MEMS, as it enables the realization of advanced microtransducers that benefit from the mechanical properties of the SiC on low-cost Si substrates through established fabrication processes (including silicon micromachining). In addition, Si wafers with diameters up to 300 mm are now readily available, contributing to the overall reduction of device production costs.

In addition to the above, the relatively new material graphene, consisting of a two-dimensional sheet of carbon, is currently an extremely active area of research due to graphene's many desirable properties (including extremely high fracture strength and electrical and thermal conductivities, lubrication properties, optical thinness (making the graphene appropriate for electronic screens), and excellent functionality (for sensors).

However, existing methods for forming graphene suffer from a number of difficulties. For example, micromechanical exfoliation of graphene requires careful use of adhesion tape to peel individual sheets of graphene from bulk graphite. This process is time consuming, is only suitable for single devices, and the thickness distribution of the exfoliated graphene layers cannot be controlled. In an alternative process, high temperature sublimation of carbon from bulk crystalline SiC produces high quality films compatible with semiconductor fabrication methods, but bulk SiC wafers are extremely expensive, and the sublimation process is incompatible with SiC on Si substrates due to the high temperatures required. Finally, Chemical Vapor Deposition (CVD) growth of graphene on metal foils produces very high quality graphene films, however an additional process step is than required to transfer the graphene from the metal foils and onto the desired substrates. Moreover, the process is incompatible with standard semiconductor fabrication methods.

It is desired to provide a process for forming graphene that alleviates one or more difficulties of the prior art, or that at least provides a useful alternative.

SUMMARY

In accordance with some embodiments of the present invention, there is provided a process for forming graphene, including:
  depositing at least two metals onto a surface of silicon carbide (SiC), the at least two metals including at least one first metal and at least one second metal; and
  heating the SiC and the first and second metals under conditions that cause the at least one first metal to react with silicon of the silicon carbide to form carbon and at least one stable silicide, and the corresponding solubilities of the carbon in the at least one stable silicide and in the at least one second metal are sufficiently low that the carbon produced by the silicide reaction forms a graphene layer on the SiC.

In some embodiments, the corresponding solubility of carbon in the at least one second metal is lower than the corresponding solubility of carbon in the at least one stable silicide. In some embodiments, the first at least one metal is nickel, and the second at least one metal is copper.

In accordance with some embodiments of the present invention, there is provided a process for forming graphene layers, including:
  depositing a Ni/Cu layer onto a surface of silicon carbide, the Ni/Cu layer being composed substantially of nickel and copper;
  heating the resulting structure to cause at least a portion of the nickel to react with a corresponding portion of the silicon carbide to form carbon and a metallic layer including a nickel silicide and any remaining unreacted nickel and copper, wherein the carbon is in the form of a graphene layer disposed between the remaining silicon carbide and the metallic layer.

In some embodiments, the process includes removing the metallic layer to expose the underlying graphene layer.

In some embodiments, the silicon carbide is in the form of a thin film disposed on a substrate. In some embodiments, the substrate is a silicon substrate.

In some embodiments, the thin film of SiC is in the form of mutually spaced islands of silicon carbide disposed on the silicon substrate.

In some embodiments, the process includes removing at least a portion of the substrate under the silicon carbide islands to free a corresponding portion of the mutually spaced islands of silicon carbide.

In some embodiments, the graphene layer is part of a MEMS transducer.

In some embodiments, the silicon carbide is substantially amorphous.

In some embodiments, said heating step is performed in an inert gas atmosphere. In some embodiments, said heating step is performed under vacuum. Said vacuum may have a pressure of about $10^{-4}$ to $10^{-3}$ mbar.

In some embodiments, said heating step includes heating the SiC and the first and second metals to a temperature of at least 800° C. In some embodiments, said heating step includes heating the SiC and the first and second metals to a temperature of about 1000° C. In some embodiments, said heating step includes heating the SiC and the first and second metals to a temperature of about 1050° C.

In some embodiments, said heating step is a rapid thermal processing (RTP) heating step.

Also described herein is a process for forming graphene, including:
depositing at least two metals onto a surface of silicon carbide, the at least two metals including at least one first metal and at least one second metal; and
heating the SiC and the first and second metals under conditions that cause the at least one first metal to react with silicon of the silicon carbide to form at least one stable silicide, and the corresponding solubilities of carbon in the at least one stable silicide and in the at least one second metal are sufficiently low that carbon produced by the silicide reaction forms a graphene layer on the SiC.

The corresponding solubility of carbon in the at least one second metal may be lower than the corresponding solubility of carbon in the at least one stable silicide. The first at least one metal may be nickel, and the second at least one metal may be copper.

Also described herein is a process for forming graphene layers, including:
depositing a Ni/Cu layer onto a surface of silicon carbide, the Ni/Cu layer being composed substantially of nickel and copper;
heating the resulting structure to cause at least a portion of the nickel to react with a corresponding portion of the silicon carbide to form carbon and a metallic layer including a nickel silicide and any remaining unreacted nickel and copper, wherein the carbon is in the form of a graphene layer disposed between the remaining silicon carbide and the metallic layer.

The process may include removing the metallic layer to expose the underlying graphene layer.

In some embodiments, the silicon carbide is a thin film of SiC disposed on a substrate. In some embodiments, the substrate is a silicon substrate. In some embodiments, the thin film of SiC is in the form of mutually spaced islands of silicon carbide disposed on the silicon substrate.

In some embodiments, the process includes removing at least a portion of the substrate under the silicon carbide islands to free a corresponding portion of the mutually spaced islands of silicon carbide. In some embodiments, the graphene layers are part of a MEMS transducer.

In accordance with some embodiments of the present invention, there is provided a structure include one or more layers of graphene formed by any one of the above processes.

Also described herein is a process for forming graphene layers, including:
depositing a Ni/Cu layer onto a silicon carbide surface, the Ni/Cu layer being composed substantially of nickel and copper;
heating the resulting structure to cause at least a portion of the nickel to react with a corresponding portion of the silicon carbide to form carbon and a metal alloy layer including a nickel silicide and any remaining unreacted nickel and copper, wherein the carbon is in the form of graphene layers disposed between the remaining silicon carbide and the metal alloy layer.

Also described herein is a process for forming graphene layers, including:
depositing at least two metals onto a silicon carbide surface, the at least two metals including a first at least one metal that forms at least one stable silicide, and a second at least one metal in which the solubility of carbon is low such that, when heated in an inert ambient, the first at least one metal reacts with the silicon of the silicon carbide to form the at least one stable silicide, and the low solubility of carbon in the second at least one metal causes the remaining carbon to precipitate in a graphitic form.

BRIEF DESCRIPTION OF THE DRAWINGS

Some embodiments of the present invention are hereinafter described, by way of example only, with reference to the accompanying drawings, wherein.

DETAILED DESCRIPTION

Described herein are new processes for forming a graphene layer between SiC and a combination of at least two metals, including at least one first metal and at least one second metal, the process including heating the SiC and the first and second metals under conditions that cause the at least one first metal to react with silicon of the silicon carbide to form at least one stable silicide, and wherein the corresponding solubilities of carbon in the at least one stable silicide and in the at least one second metal are sufficiently low that carbon produced by the silicide reaction forms a graphene layer between the SiC and the overlying metal/silicide. The at least one second metal may be chosen such that the corresponding solubility of carbon in the at least one second metal is lower than the corresponding solubility of carbon in the at least one stable silicide.

In some embodiments, the combination of at least two metals is a combination of Ni and Cu. In some embodiments, the SiC is amorphous. In other embodiments, the SiC is crystalline. In some embodiments, the SiC is in the form of a thin film of SiC supported on a substrate, which may or may not be a silicon substrate. In some embodiments, the SiC is in the form of a thin film of 3C—SiC on a (100) or (111) Si surface. The thin film of SiC can be formed on a Si wafer using a method and apparatus as described in WO2010/091473, entitled "A chemical vapour deposition system and process", the entirety of which is hereby incorporated by reference.

Figure 1:
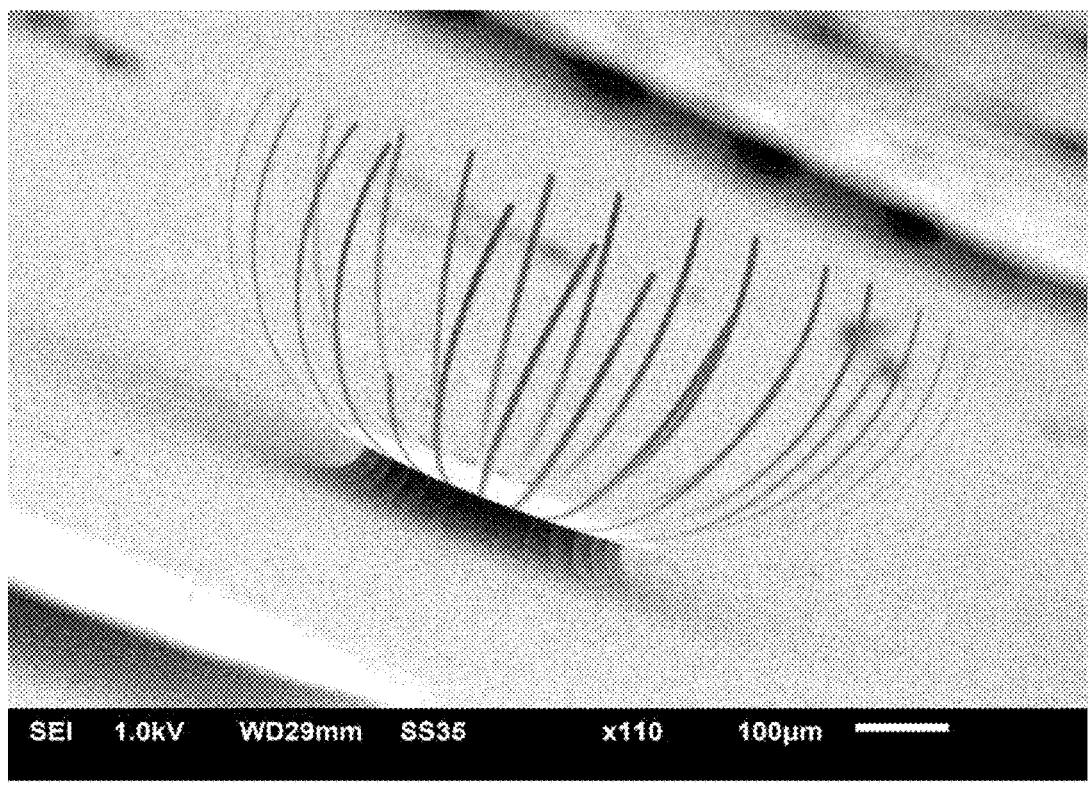
FIG. 1 is a scanning electron microscope image of a SiC cantilever structure attached to a silicon wafer.

Additionally, the thin film of SiC can be patterned and etched using a process such as that described in Australian Provisional Patent Application No. 2013902931, entitled "A silicon carbide etching process" (the entirety of which is hereby incorporated by reference) to form micromachined structures (which may be freestanding) that can be used as sensors and/or transducers. FIG. 1 is a scanning electron microscope image of such a structure.

In some embodiments, a combination of Ni and Cu is deposited onto the surface of the SiC (e.g., by sputtering or thermal evaporation). In some embodiments, the Ni is deposited first, onto the SiC surface, and the Cu is then deposited onto the Ni. In some embodiments, the SiC is patterned prior to the deposition of these metals to form mutually spaced SiC islands on the substrate.

In the described embodiments, the resulting structure is then heated in a substantially inert ambient (e.g., a vacuum of $10^{-3}$ mbar or less, preferably between $10^{-4}$ mbar and $10^{-3}$ mbar so that some oxygen is present, or an inert gas atmosphere such as argon) to a temperature of at least 800° C., with the best results obtained at a temperature around 1000° C. so that the Ni undergoes a solid phase reaction with the underlying SiC. Using this method, the best quality graphene layers have been found to be formed at, temperatures of about 1050° C. Under these conditions, two reaction products are formed: a Nickel Silicide (whose stoichiometry depends on temperature) and elemental Carbon (C). The low solubility of C in the silicide causes a thin layer or film of carbon to form, in the form of one or more sheets of graphene. The presence of Cu further decreases the overall solubility of C, and is found to increase the crystallinity of the graphene.

Figure 3:
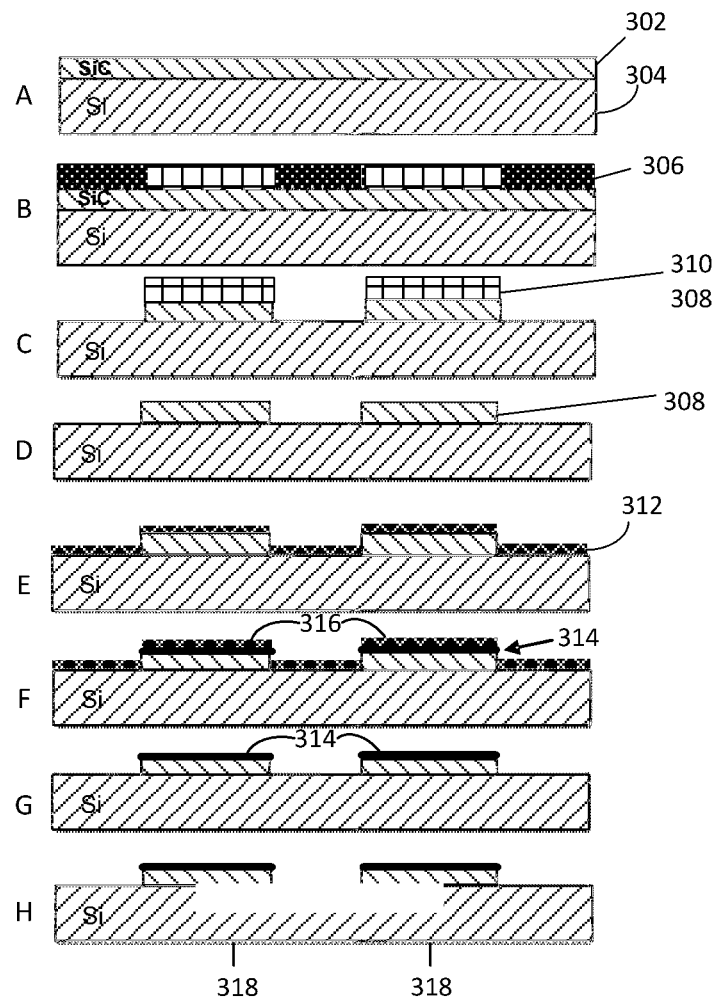
FIG. 3 is a set of schematic cross-sectional side views of a wafer at different stages of the process of FIG. 2.
Figure 5:
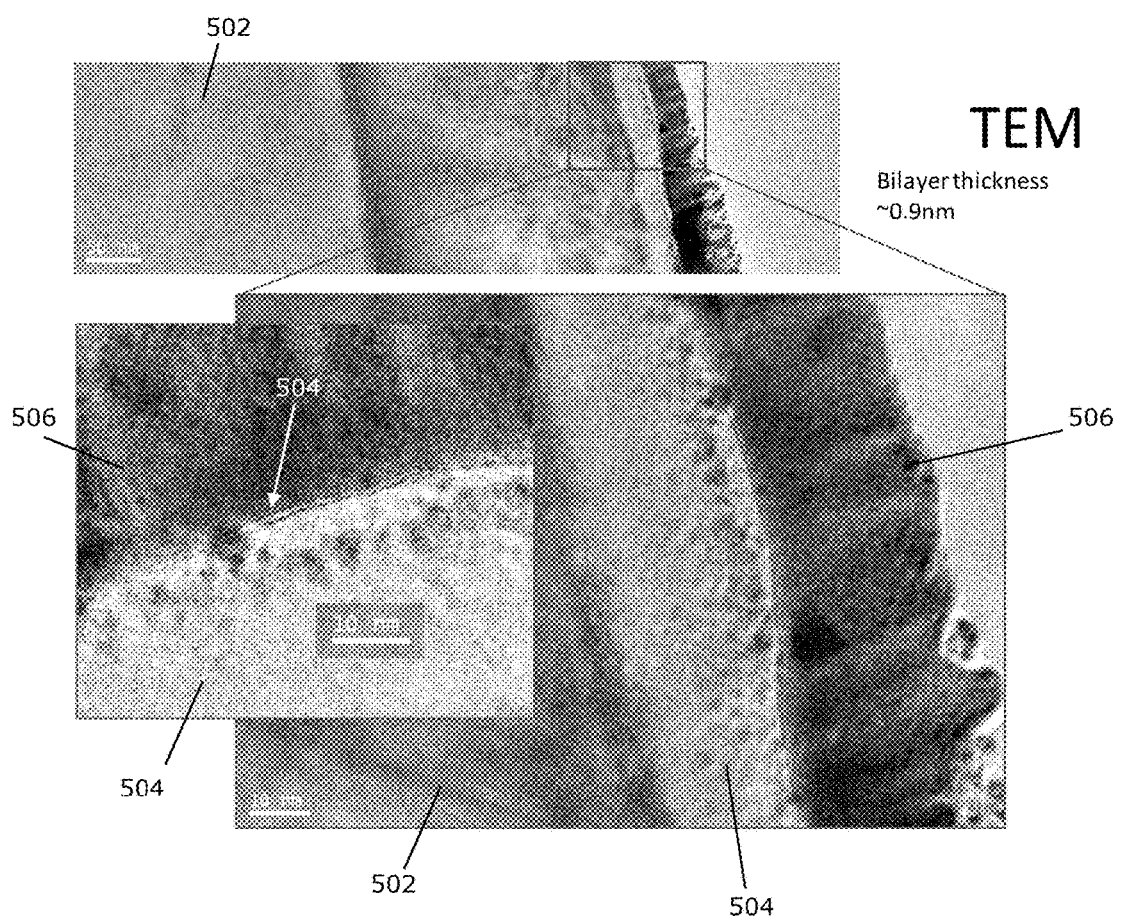
FIG. 5 is a set of three cross-sectional transmission electron microscopy (XTEM) images of a sample processed in accordance with the process of FIG. 2 at successively higher magnifications and showing graphene layers disposed between a SiC layer and a metallic capping layer.

As shown in FIGS. 3 and 5, the graphene layer forms between the SiC layer and a metal layer constituted by the silicide produced by the reaction and any remaining portion of the original metals. This metal layer can then be removed (e.g., by wet etching) to expose the graphene. Because the graphene forms directly on the SiC, the described processes avoid any need for manual transfer of the graphene film, which is a significant limitation of other approaches, and facilitate making electrical contact to the graphene. In practice, graphene films formed by the processes described herein are found to have significantly improved electrical conductivity relative to transferred graphene films, and, when used in SiC/graphene transducers as described above, effectively do not change the resonance frequency of such transducers.

Figure 2:
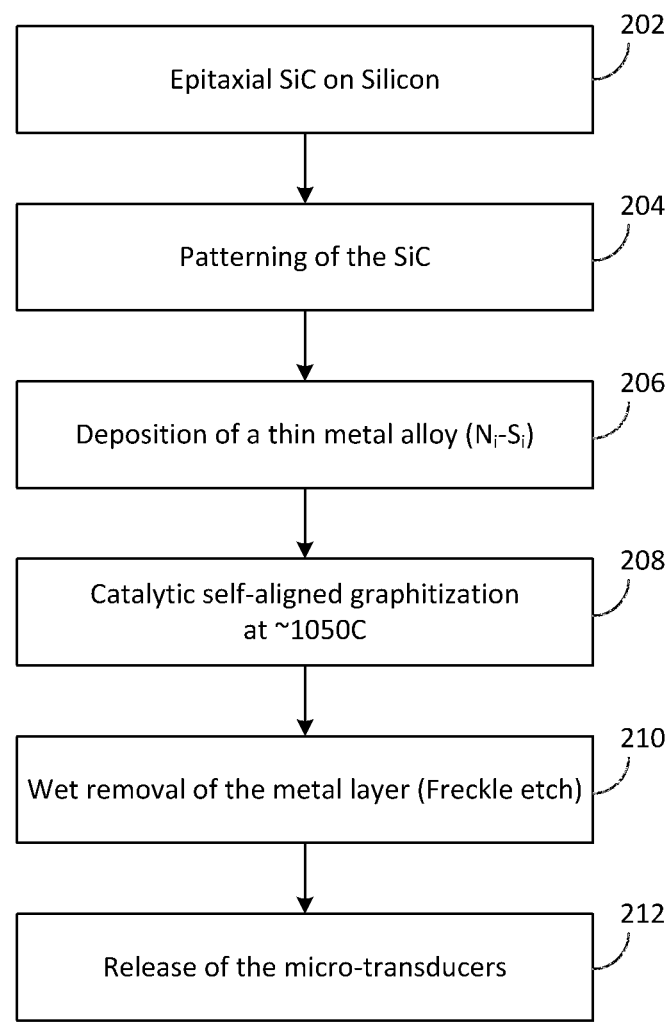
FIG. 2 is a flow diagram of a process for forming graphene layers in accordance with some embodiments of the present invention.

In one example, as shown in the flow diagram of FIG. 2 and the schematic cross-sectional side views of FIG. 3, the process begins at step 202 by receiving a composite substrate or wafer consisting of a thin film 302 of epitaxial SiC on a single-crystal silicon substrate 304 (in this example, being of (111) orientation) (FIG. 3A). At step 204, the SiC film 302 is patterned using standard photolithography. That is, by depositing a layer of photoresist 306 over the sample, and exposing selected regions of the photoresist 306 to UV light (FIG. 3B), and then developing the photoresist 306 so that only selected regions 310 of the photoresist remain on the sample, as shown in FIG. 3C. Subsequently, the exposed regions of the SiC layer 302 are removed by etching to form mutually spaced islands 308 of SiC capped by the photoresist 310 (FIG. 3D). The remaining photoresist 310 is then stripped from the sample, leaving only the SiC islands 308 as shown in FIG. 3D.

At step 206, a thin metal alloy layer 312 of Cu and Ni is deposited over the sample, as shown in FIG. 3E. At step 208, the entire sample is heated to a temperature of about 1050° C. for a period of 1 hour in a substantially inert ambient (e.g., under a partial vacuum of $10^{-4}$-$10^{-3}$ mbar), which causes a layer of graphene 314 to form at the interface between the SiC and the metal alloy layer 312, as described above and shown in FIG. 3F.

Figure 4:
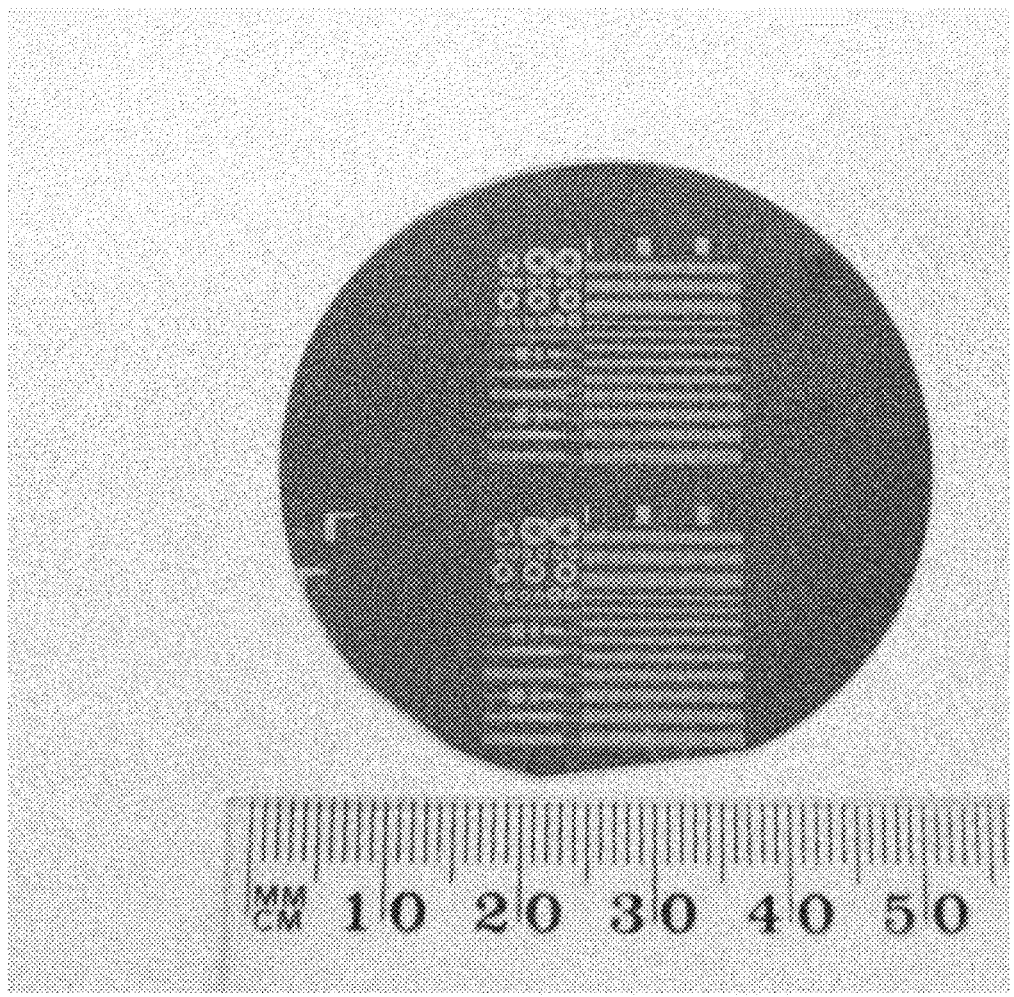
FIG. 4 is a photograph of a full wafer of graphene devices produced using the process of FIGS. 2 and 3.

At step 210, the resulting metallic layer 316 (consisting of any remaining alloy and silicide formed by reaction of at least one of the metals with the SiC) is removed from the sample (in this example, by a Freckle etch) to expose the graphene 314 and produce the structure shown in FIG. 3G. Finally, at step 212, a further patterning step and etch step can be used to selectively remove a portion of the silicon substrate 304 under a portion of each SiC/graphene island to partially free those parts and form suspended structures, 318 as shown in FIG. 3H (which may be, for example, linear cantilevers, or more complex structures such as those shown in FIGS. 1 and 4). Alternatively, the structures may be completely released by etching all of the substrate 304 under the structures to form singulated structures of graphene on SiC.

Table 1 compares the results of Hall effect measurements performed on (i) graphene films on SiC by the processes described herein, and (ii) the bare SiC film, demonstrating that by adding the graphene film to the SiC film, the resulting bilayer structure exhibits orders of magnitude lower sheet resistance ($R_s$) and a 10-fold increase in charge carrier mobility ($\mu$). In this example, the graphene was formed on SiC(111) by heating the sample to a temperature of about 1050° C. in a vacuum furnace for a period of about 1 hour at a pressure of about $10^{-3}$ mbar.

TABLE 1

|  | Graphene on crystalline SiC | Crystalline SiC only |
|---|---|---|
| Sheet Resistance $R_s$ | $2.1 \times 10^2$ Ω/□ | $7.1 \times 10^4$ Ω/□ |
| Hole Mobility $\mu_H$ | 340 cm$^2$ V$^{-1}$ s$^{-1}$ | 36 cm$^2$ V$^{-1}$ s$^{-1}$ |

FIG. 5 includes three cross-sectional transmission electron microscopy (XTEM) images at different magnifications of a sample similar to that described above, but where the SiC was of (100) orientation and was heated to a temperature of about 1100° C. for about 1 hour at a pressure of $10^{-3}$ mbar. The images show the underlying silicon substrate 502, the SiC film 504, and an overlying gold layer 506 deposited as part of the sample preparation for TEM, and, in the highest resolution image, the graphene layer 508, in this example being in the form of a double sheet having a thickness of about 0.9 nm.

Figure 6:
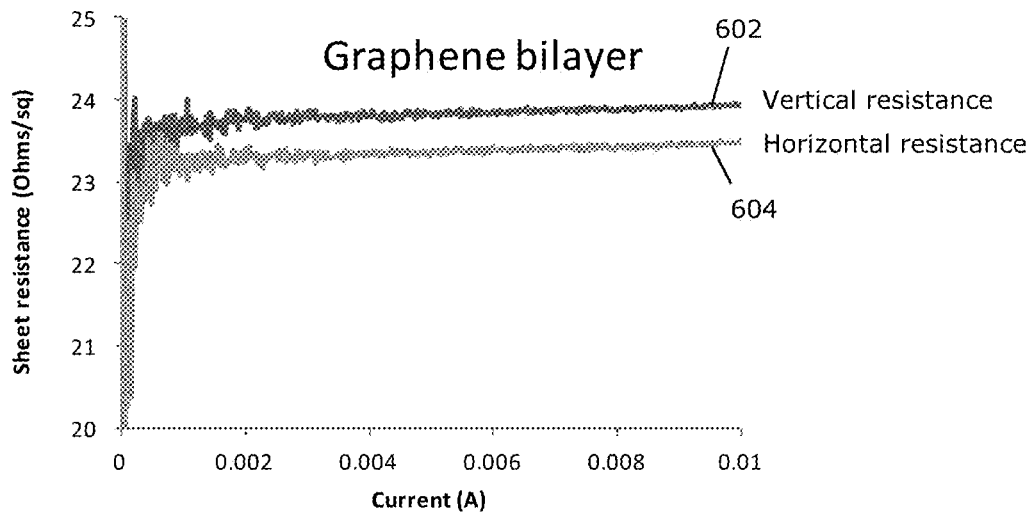
FIGS. 6 and 7 are graphs of sheet resistance as a function of electrical current for a two-sheet graphene layer and a Ni—Cu film, respectively.
Figure 7:
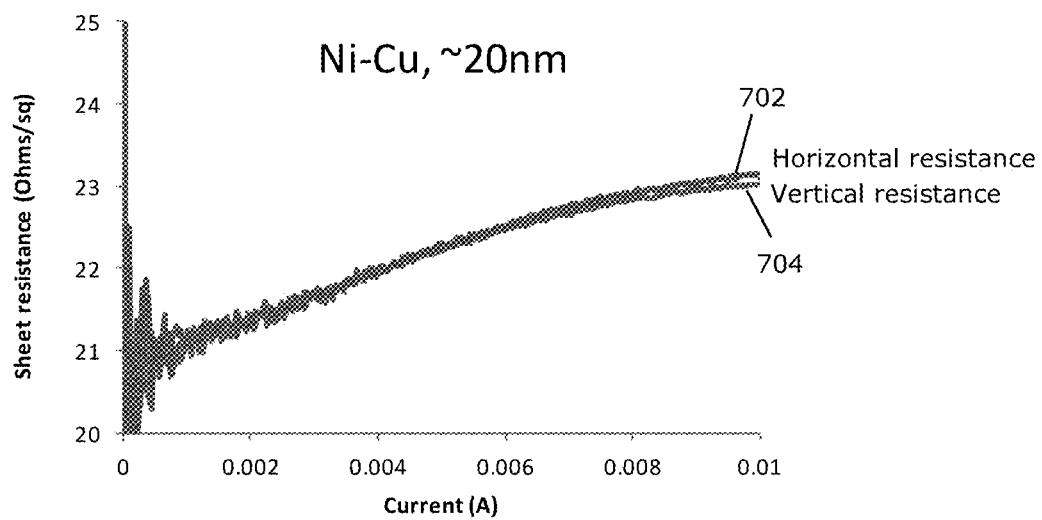

FIG. 6 is a graph of the vertical 602 and horizontal 604 sheet resistance of the ~1 nm graphene layer (of two sheets) 508 shown in FIG. 5 as a function of the electric current passing through it. For the purpose of comparison, FIG. 7 is a corresponding graph of vertical 702 and horizontal 704 sheet resistance, but for a Ni—Cu film having a much greater thickness of about 20 nm. Considering that the measured sheet resistances of these two layers are similar, but that the metal film is more than an order of magnitude thicker, it is immediately apparent that the resistivity of the graphene is vastly greater than that of the (oxidised) metal film. Indeed, the resistivity of the graphene layer is calculated to be about $2\times10^{-8}$ Ω-m, whereas the resistivity of the metal film is about $4\times10^{-7}$ Ω-m (which is approximately equal to the resistivity of titanium). Considering the atomic scale thickness of the two-sheet graphene layer, it will be apparent that its resistivity is remarkably low. For example, even if it was possible to deposit a uniform ~1 nm thick layer of gold, one of the most electrically conductive metals, its resistivity would be at least 10 times greater than the resistivity of bulk gold due to spatial confinement below the electron mean free path. Any other metal would suffer from partial or total oxidation. Consequently, it will be apparent that the properties of the graphene layers produced by the processes described herein are particularly advantageous.

Finally, the relatively insensitivity of the graphene sheet resistance to electrical current evident from the data in FIG. 6 suggests that the graphene layer suffers far less from Joule heating than the oxidised metal layer of FIG. 7 (as suggested by the positive slope of the sheet resistance data in that figure). Consequently, conductive sheets of graphene formed by the processes described herein may have drastically higher thermal conduction and improved reliability relative to metal layers having similar physical dimensions. In other words, the described graphene layers may enable unprecedented levels of miniaturisation for certain applications.

Figure 8:
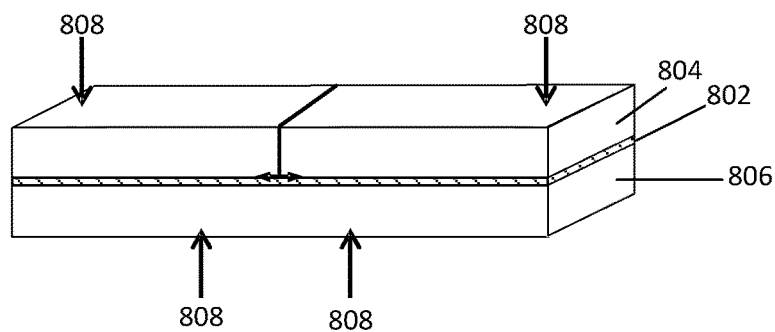
FIGS. 8 and 9 are schematic diagrams illustrating an arrangement for performing adhesion energy measurements on graphene layers formed by the process of FIG. 2.

As expected, graphene layers formed in situ by the processes described herein have superior adhesion to graphene layers transferred from graphite. FIG. 8 is a schematic diagram illustrating the configuration of a four-point bending test that is used to measure the adhesion energy of graphene layer 802 sandwiched between at least one top layer 804 and at least one bottom layer 806. The application of generally opposing forces to the outer layer 804, 806, as represented by the arrows 808 in FIG. 8, eventually cause the topmost layer(s) 804 to crack, as shown in FIG. 9, and the separation of the graphene layer 807 from the layers 804, 806 immediately adjacent can be measured to quantitatively assess the adhesion energy.

Figure 9:
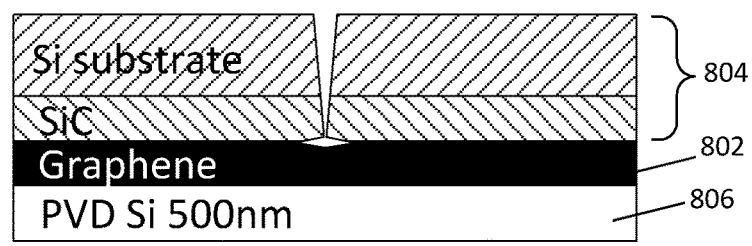
Figure 10:
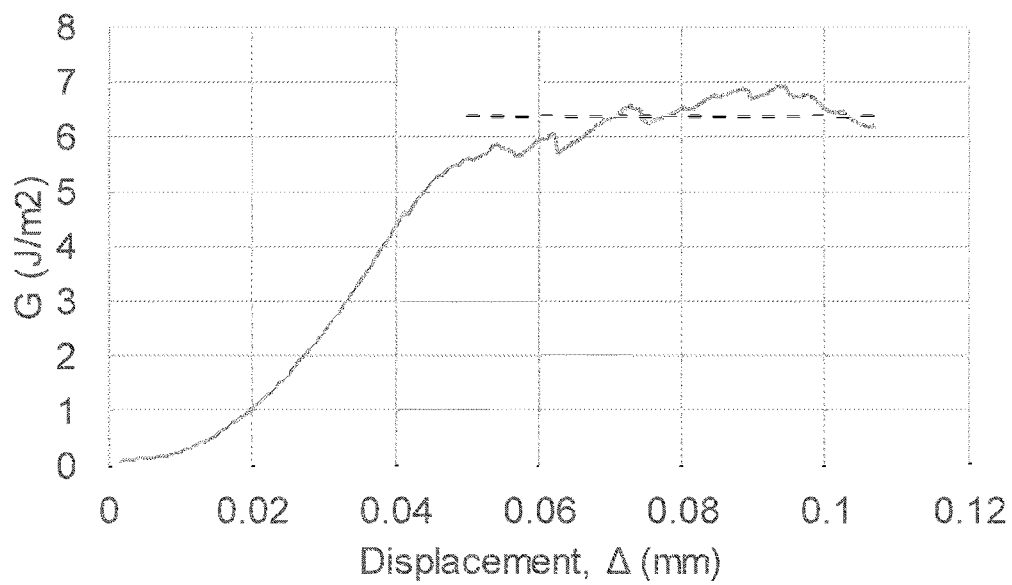
FIG. 10 is a graph of the energy release rate for debonding (layer separation) of an interface adjacent to the graphene layer, as measured using the arrangement shown in FIG. 8.

FIG. 10 is a graph indicating the adhesion energy of a graphene layer formed as described above (SiC(111), furnace heating at 1100 C for 1 hour), as calculated from the applied mechanical load to obtain a steady-state interfacial crack propagation or "displacement" using the general arrangement shown in FIGS. 8 and 9. In this example, the adhesion energy of the graphene (capped by a 500 nm Si film deposited by PVD) to the SiC film is expected to be much higher than the adhesion energy of a graphene film grown ex situ and subsequently transferred to an $SiO_2$ substrate has been measured to be around 0.45 $m^{-2}$, as described in S. P. Koenig, N. G. Boddeti, M. L. Dunn, and J. S. Bunch, Nature Nanotechnology 6 (543-546) (2011).

Although graphene layers can be formed in this general manner using only Ni on the SiC surface, the inventors have determined that the addition of at least one second metal in which the solubility of carbon is very low (e.g., Cu) improves the crystallinity of the graphene layers as measured by Raman spectroscopy.

Figure 11:
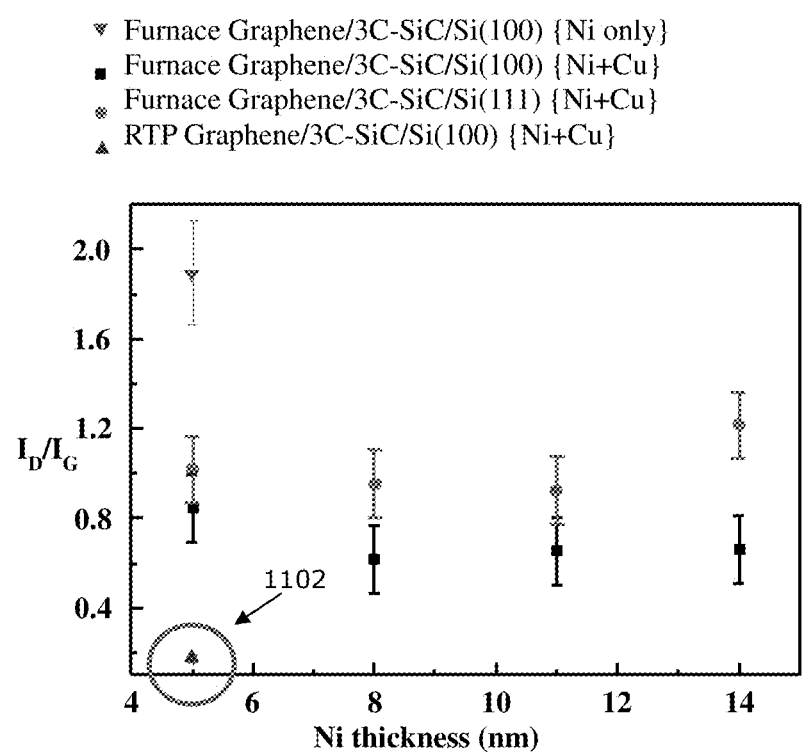
FIG. 11 is a graph representing the defect densities of graphene layers formed by the process of FIG. 2 (as assessed using Raman spectroscopy) as a function of the initial thickness of the Ni metal layer of each sample.

FIG. 11 is a graph representing the quality of graphene layers formed using the processes described herein as a function of the thickness of the initial metal layer deposited on the SiC, comparing also: (i) the use of (100) and (111) Si substrates, (ii) the use of nickel only and nickel+copper as the initial metal layer, and (iii) the use of conventional furnace processing with rapid thermal processing (RTP).

In this example, the quality of the graphene layers was assessed using Raman spectroscopy, specifically using a measure known in the art as "the $I_D/I_G$ ratio" which is a measure of the defect density of the graphene layers, as described in A. C. Ferrari and D. M. Basko, Nature Nanotechnology 8, 235 (2013). Accordingly, a perfect graphene layer would have an $I_D/I_G$ ratio approaching zero.

The data in FIG. 11 shows that, while there is only a relatively weak dependence on the metal film thickness, the defect density in the graphene layers is reduced by about a factor of two when the metal film includes both nickel and copper, rather than nickel alone. Additionally, the data demonstrate that the quality of the graphene layers is degraded when grown on SiC films formed on silicon substrates having a (111) orientation, relative to those where the silicon substrates have a (100) orientation.

Finally, the data demonstrate that the quality of the graphene layers is vastly improved (in this example, by about a factor of four (symbol 1102)) when a sample is heated using rapid thermal processing (in this example, 4 minutes at 1100° C.) rather than furnace heating. Additionally, the uniformity of the resulting graphene layers is improved when formed using RTP, as is apparent from the error bars on the corresponding symbol in FIG. 5 being smaller than the size of the symbol used to represent the data point.

Finally, the processes described herein provide the first viable route to the microfabrication of graphene/SiC devices on silicon at the wafer scale.

Compared to the prior art method of growing graphene layers by CVD on metal foils, the described processes do produce graphene layers of lower quality. The substrate surface after the reaction is significantly rougher than prior to the reaction (~3 nm RMS roughness vs ~40 nm RMS roughness). However, the impact of this roughness depends upon the application. For example, the roughness should not be relevant for manufacturing transducers, but may be more relevant for other electronic applications.

The described processes form graphene at relatively low temperatures compared to sublimation processes (~1000° C. versus 1300° C. for the latter), and can yield high quality graphene on epitaxial SiC films.

The described processes are scalable for producing graphene layers consisting of one or more graphene sheets for micro and nano-devices on a mass production level. Graphene/SiC transducer devices have been proven on wafers that can be manufactured with standard semiconducting processing methodologies. Furthermore, no additional photo-lithography (self-aligned patterning of graphene) is needed, resulting in low processing costs.

Graphene layers produced by the described processes are particularly applicable to advanced technologies where graphene has a strong advantage, including chemical and mechanical sensing, and optical applications where its non-linear optics, in particular saturable absorption properties, outperform rival technologies at a substantially lower cost. The production of graphene devices using the described processes is self-aligned, and can be scaled up to large wafer sizes. As a process technology, the described processes can be utilised and further developed across a wide range of applications, including graphene micro-transducers (a subset of MEMS), and non-linear optical devices.

Many modifications will be apparent to those skilled in the art without departing from the scope of the present invention.

The invention claimed is:

1. A process for forming graphene, comprising:
    depositing at least two metals onto a surface of silicon carbide (SiC), the at least two metals comprising at least one first metal and at least one second metal; and
    heating the SiC and the first and second metals under conditions that cause the at least one first metal to react with silicon of the silicon carbide to form carbon and at least one stable silicide, wherein corresponding solubilities of the carbon in the at least one stable silicide and in the at least one second metal are sufficiently low that the carbon produced by the silicide reaction forms a graphene layer disposed between the at least one stable silicide and the remaining SiC, and wherein the at least one second metal is chosen such that the corresponding solubility of carbon in the at least one second metal is lower than the corresponding solubility of carbon in the at least one stable silicide.

2. The process of claim 1, wherein the first at least one metal is nickel, and the second at least one metal is copper.

3. A process for forming graphene layers, comprising:
depositing one or more layers, collectively substantially composed of nickel and copper, onto a surface of silicon carbide;
heating the resulting structure to cause at least a portion of the nickel to react with a corresponding portion of the silicon carbide to form a carbon and a metallic layer comprising a nickel silicide and any remaining unreacted nickel and copper, wherein the carbon is in a form of a graphene layer disposed between remaining silicon carbide and the metallic layer.

4. The process of claim 3, comprising removing the metallic layer to expose the underlying graphene layer.

5. The process of claim 1, wherein the silicon carbide is in the form of a thin film disposed on a substrate.

6. The process of claim 5, wherein the substrate is a silicon substrate.

7. The process of claim 6, wherein the thin film of SiC is in the form of mutually spaced islands of silicon carbide disposed on the silicon substrate.

8. The process of claim 5, comprising removing at least a portion of the substrate under the silicon carbide islands to free a corresponding portion of the mutually spaced islands of silicon carbide.

9. The process of claim 1, wherein the graphene layer is part of a micro-electro-mechanical systems (MEMS) transducer.

10. The process of claim 1, wherein the silicon carbide is substantially amorphous.

11. The process of claim 1, wherein said heating step is performed in an inert gas atmosphere.

12. The process of claim 1, wherein said heating step is performed under vacuum.

13. The process of claim 12, wherein said vacuum has a pressure of about $10^{-4}$ to $10^{-3}$ mbar.

14. The process of claim 1, wherein said heating step comprises includes heating the SiC and the first and second metals to a temperature of at least 800° C.

15. The process of claim 1, wherein said heating step comprises includes heating the SiC and the first and second metals to a temperature of about 1000° C.

16. The process of claim 15, wherein said heating step comprises heating the SiC and the first and second metals to a temperature of about 1050° C.

17. The process of claim 1, wherein said heating step is a rapid thermal processing (RTP) heating step.

18. A structure comprising one or more layers of graphene formed by the process of claim 1.

* * * * *